(12) United States Patent  (10) Patent No.: US 7,796,085 B2
Fujii  (45) Date of Patent: Sep. 14, 2010

(54) ANTENNA AND WIRING BOARD

(75) Inventor: Tomoharu Fujii, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 525 days.

(21) Appl. No.: 11/586,624

(22) Filed: Oct. 26, 2006

(65) Prior Publication Data

US 2007/0096992 A1 May 3, 2007

(30) Foreign Application Priority Data

Oct. 28, 2005 (JP) .......................... P .2005-314506

(51) Int. Cl.
 *H01Q 1/38* (2006.01)
(52) U.S. Cl. ............... 343/700 MS; 343/702; 343/725; 343/846; 343/893
(58) Field of Classification Search .......... 343/700 MS, 343/702, 725, 728, 846, 848, 830, 893
See application file for complete search history.

(56) References Cited

U.S. PATENT DOCUMENTS

| 5,307,075 | A | * | 4/1994 | Huynh ................ 343/700 MS |
| 5,929,825 | A | * | 7/1999 | Niu et al. .................... 343/895 |
| 6,674,405 | B2 | * | 1/2004 | Wang ................. 343/700 MS |
| 6,982,675 | B2 | * | 1/2006 | Kwak et al. .................. 343/702 |
| 7,026,999 | B2 | * | 4/2006 | Umehara et al. ............ 343/702 |
| 7,046,197 | B2 | * | 5/2006 | Okado ................. 343/700 MS |
| 7,053,837 | B2 | * | 5/2006 | Il et al. ................. 343/700 MS |
| 7,218,282 | B2 | * | 5/2007 | Humpfer et al. ...... 343/700 MS |
| 7,339,535 | B2 | * | 3/2008 | Liang et al. ................. 343/702 |
| 2002/0000939 | A1 | * | 1/2002 | Kaiponen ............ 343/700 MS |
| 2005/0062651 | A1 | * | 3/2005 | Dai et al. .............. 343/700 MS |

FOREIGN PATENT DOCUMENTS

| JP | 05-211406 | 8/1993 |
| JP | 08-330830 | 12/1996 |
| JP | 2003-124742 | 4/2003 |
| JP | 2005-110109 | 4/2005 |
| JP | 2005-110110 | 4/2005 |
| JP | 2005-142739 | 6/2005 |

* cited by examiner

*Primary Examiner*—Douglas W Owens
*Assistant Examiner*—Chuc D Tran
(74) *Attorney, Agent, or Firm*—Drinker Biddle & Reath LLP

(57) ABSTRACT

An antenna 1 which is incorporated in a multilayer wiring board 2 has: radiating elements 11-1, 11-2, 11-3, and 11-4 which are laid on faces of A-, B-, and C-layers of the wiring board 2, respectively; power supplying portions 12-1, 12-2, 12-3, and 12-4 which are laid on the faces of the layers, respectively to supply an electric power to the radiating elements 11-1, 11-2, 11-3, and 11-4; short-circuiting portions 13-1, 13-2, 13-3, and 13-4 which are laid on the faces of the layers, respectively to ground the radiating elements 11-1, 11-2, 11-3, and 11-4; and a connecting portion 14 which penetrates the A-, B-, and C-layers of the wiring board 2, and through which the power supplying portions 12-1, 12-2, 12-3, and 12-4 are electrically connected to each other.

5 Claims, 7 Drawing Sheets

ANTENNA AND WIRING BOARD

TECHNICAL FIELD

The present disclosure relates to an antenna which is to be incorporated in a multilayer wiring board, and also to such a wiring board.

RELATED ART

With the advancement of the radio technology, improvement of characteristics of an antenna such as the frequency band and the gain, and miniaturization of an antenna structure are requested to be further improved. FIG. 10 is a view showing usual quarter-wave antennas, FIG. 10A shows a monopole antenna, FIG. 10B shows an inverted-L antenna, and FIG. 10C shows an inverted-F antenna.

The inverted-L antenna shown in FIG. 10B is an antenna in which the radiating element is bent at the middle for the purpose of miniaturizing the monopole antenna shown in FIG. 10A. The inverted-L antenna has a defect that the portion Y in the illustrated radiating element cannot be largely reduced in size because of the following reason. As the portion Y of the radiating element is made smaller, the capacitance component between the portion X of the radiating element and the GND (ground) is further increased. As a result, the reactance component of the antenna is changed, and the impedance matching between a power supplying portion and the antenna is not attained. Therefore, miniaturization of the inverted-L antenna has its limits.

The inverted-F antenna shown in FIG. 10C is an antenna having a structure in which a short-circuiting portion is disposed in the vicinity of a power supplying portion in order to easily attain the impedance matching of the inverted-L antenna. The inverted-F antenna has a feature that it radiates both two polarized waves or the vertically and horizontally polarized waves, and is used as a small nondirectional antenna in various small radio apparatuses such as a portable telephone. FIG. 11 is a diagram showing the basic principle of a usual inverted-F antenna. The portion L in the figure determines the frequency of the inverted F antenna 50. The capacitance component which is formed in the vicinity of a region β by making the portion L closer to the GND. By contrast, the reactance component is formed in the vicinity of a region α by short-circuitng a radiating element 52 in the vicinity of a power supplying portion 51 to the GND, so as to attain the impedance matching between the antenna and the power supplying portion. As an inverted-F antenna, there is a three-dimensional antenna such as shown in FIG. 12 in addition to the planar type antenna shown in FIG. 11. FIG. 12 is a perspective view exemplarily showing a usual three-dimensional inverted-F antenna. Also in the three-dimensional inverted-F antenna 50, a radiating element 52 is short-circuited to the GND in the vicinity of a power supplying portion 51 in the same manner as the planar type antenna.

As an antenna which aims to further miniaturization, an antenna in which an inverted-L antenna and an inverted-F antenna are combined with each other has been proposed (for example, see Patent Reference 1).

In addition, several antennas which aim to reduce the size the antenna configuration while maintaining or improving antenna characteristics have been proposed (for example, see Patent References 2 and 3).

[Patent Reference 1] Japanese Patent Unexamined Publication No. 2003-124742

[Patent Reference 2] Japanese Patent Unexamined Publication No. 2005-110109

[Patent Reference 3] Japanese Patent Unexamined Publication No. 2005-110110

In the above-described related art, an antenna body can be miniaturized to a certain extent, but it is difficult to attain further miniaturization. For example, the antenna disclosed in Patent Reference 1 has a structure corresponding to an inverted-L antenna, and therefore miniaturization has its limits.

Usually, as an antenna is larger in size, characteristics of the antenna are more excellent, and, as an antenna is smaller in size, characteristics of the antenna are further impaired. In order to improve antenna characteristics, it may be contemplated that antennas are arrayed. However, the antennas occupy a large area, and there arises a problem that miniaturization is hardly attained.

Moreover, miniaturization of a small radio apparatus incorporating an antenna is expected to continuingly further advance. In a production process of such-an-apparatus, a work of incorporating an antenna into the apparatus seems to become increasingly difficult.

SUMMARY

Embodiments of the present invention provide an antenna which is small in size, which has high performance, and which can be easily produced, and also a wiring board which incorporates the antenna.

According to a first aspect of one or more embodiments of the invention, radiating elements of an antenna are laid on faces of layers of a multilayer wiring board, respectively. In a first aspect of the invention, an antenna which is incorporated in a multilayer wiring board comprises: radiating elements which are laid on faces of layers of the wiring board, respectively; power supplying portions which are laid on the faces of the layers, respectively to supply an electric power to the radiating elements; short-circuiting portions which are laid on the faces of the layers, respectively to ground the radiating elements; and a connecting portion which penetrates the layers of the wiring board, and through which the power supplying portions are electrically connected to each other.

In each of the layers of the wiring board, an inverted-F antenna configured by one of the radiating elements, one of the power supplying portions, and one of the short-circuiting portions is formed. The power supplying portions of the inverted-F antennas which are respectively formed in the layers of the wiring board are connected to each other by the connecting portion which penetrates the layers of the wiring board. The connecting portion is configured by, for example, a through hole. Alternatively, the connecting portion may be a conductive member having other configuration or shape.

Preferably, the radiating elements have different lengths. According to the configuration, it is possible to ensure a broad frequency band.

Preferably, the radiating elements, the power supplying portions, and the short-circuiting portions are patterned for each of the layers. In a process of producing a wiring board incorporating the antenna, for example, simultaneously with formation of a wiring pattern of each of the layers of the wiring board, the radiating element, the power supplying portion, and the short-circuiting portion which constitute the inverted-F antenna are formed.

As described above, the multilayer wiring board incorporating the antenna of the first aspect of the invention comprises: inverted-F antennas which are laid on faces of layers of the wiring board, each of which is configured by a radiating element, a power supplying portion for supplying an electric power to the radiating element, and a short-circuiting portion for grounding the radiating element; and a connecting portion which penetrates the layers of the wiring board, and through which the power supplying portions are electrically connected to each other.

An antenna of a second aspect of the invention comprises: a plurality of radiating elements; a power supplying portion which supplies an electric power to the radiating elements; and a short-circuiting portion through which the radiating elements and a grounding plate are connected to each other, an inverted-F antenna is formed in the antenna, and the inverted-F antenna is configured by the radiating elements, the power supplying portion, and the short-circuiting portion. Preferably, the radiating elements have different lengths.

Various implementations may include one or more the following advantages. For example, it is possible to realize an antenna which is small in size, which has high performance, and which can be easily produced, and also a wiring board which incorporates the antenna. Since the invention is realized as a wiring board which has a module function, and in which the antenna is included, the invention contributes also to further miniaturizing and sophisticating a small radio apparatus.

In a process of producing a wiring board incorporating an antenna, simultaneously with formation of a wiring pattern of each of the layers of the wiring board, a radiating element, a power supplying portion, and a short-circuiting portion which constitute an inverted-F antenna can be formed. In production of an inverted-F antenna, and a small radio apparatus including an inverted-F antenna, therefore, the production time can be shortened, and the production cost can be reduced.

Further, the radiating elements are formed so as to have different lengths, and hence it is possible to ensure a broad frequency band. When the radiating elements are formed so as to have the same length, the gain is improved. The antenna of the invention has a structure which is a sort of a stack of plural inverted-F antennas. Unlike a related-art single inverted-F antenna, antenna characteristics can be improved without changing the area occupied by the antenna.

Other features and advantages may be apparent from the following detailed description, the accompanying drawings and the claims.

DETAILED DESCRIPTION

Figure 1:
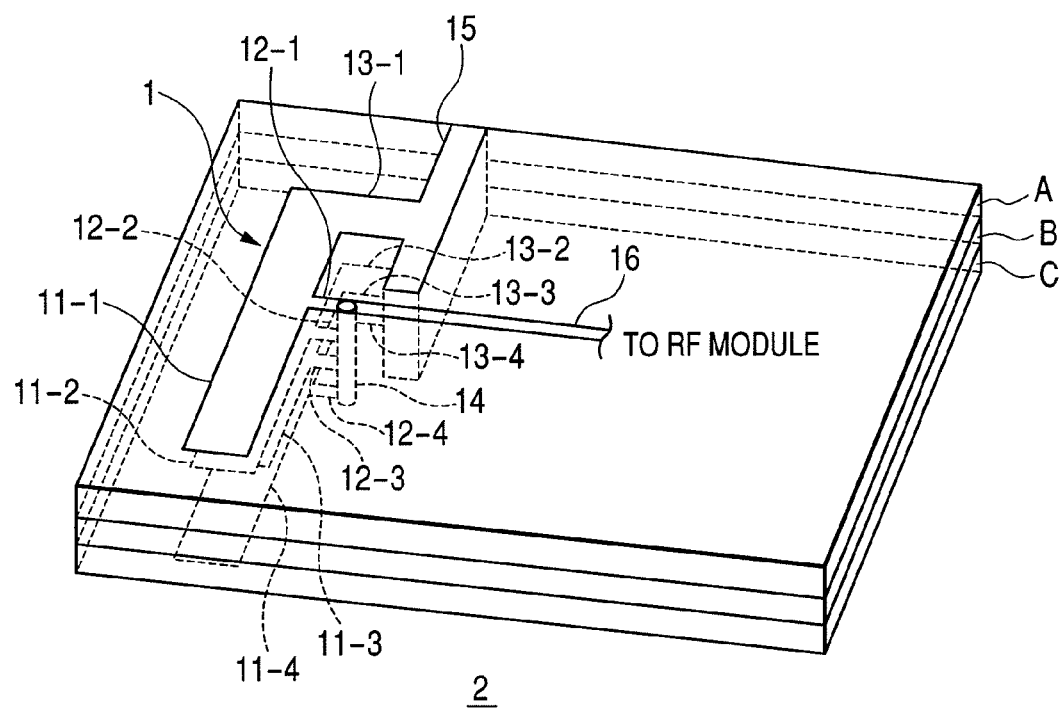
FIG. 1 is a perspective view of an antenna and a wiring board of a first embodiment of the invention.
Figure 2:
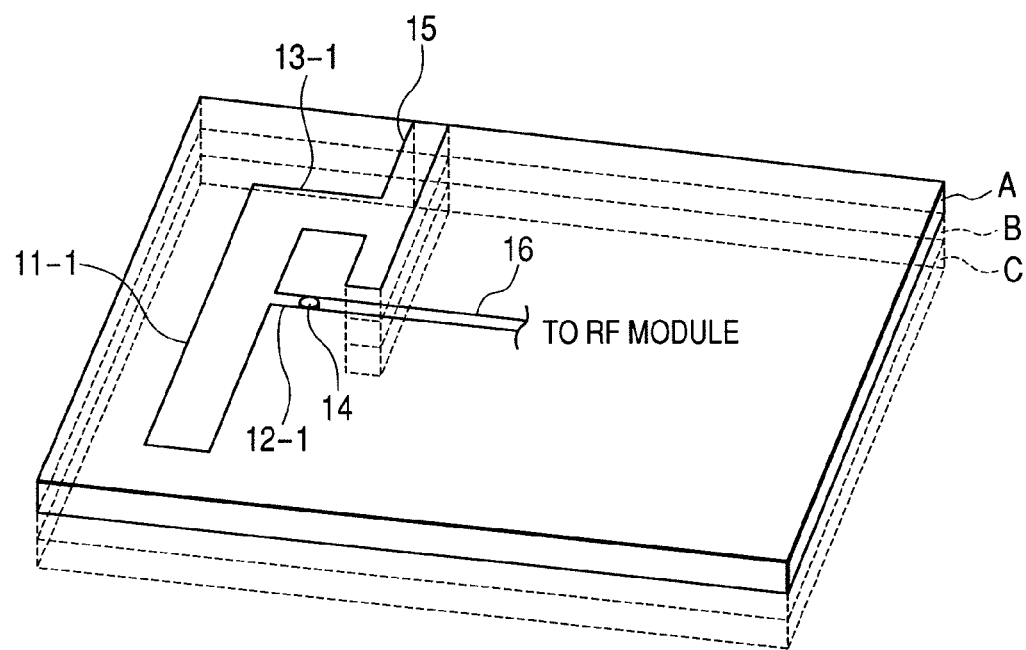
FIG. 2 is a perspective view showing an inverted-F antenna which is formed on the upper face of the uppermost layer of a three-layer wiring board shown in FIG. 1.
Figure 3:
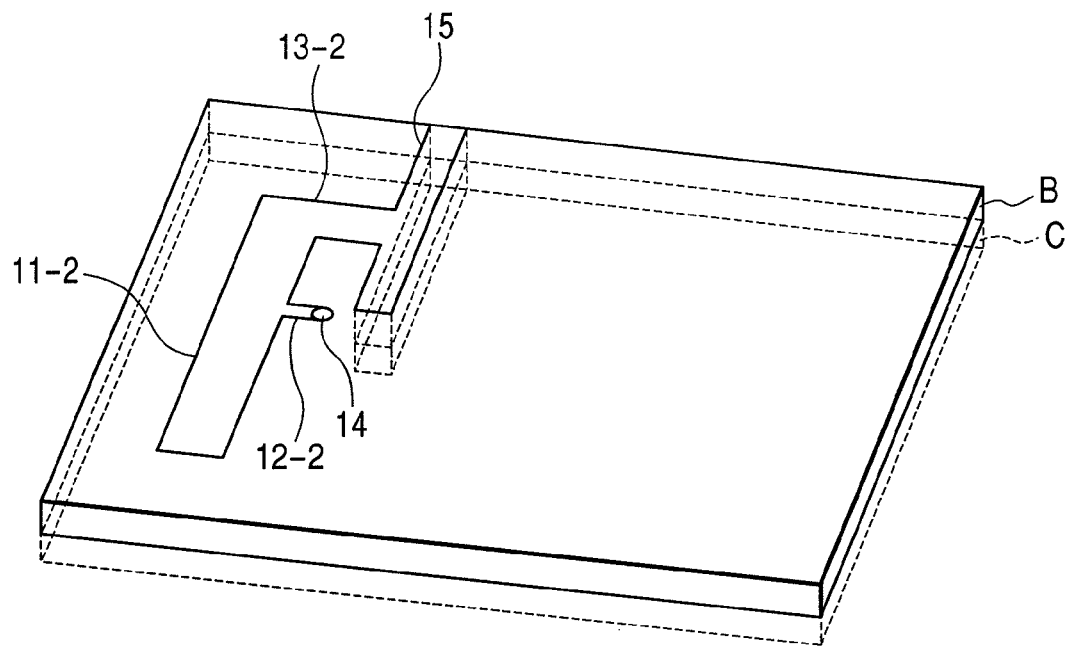
FIG. 3 is a perspective view showing an inverted-F antenna which is formed on the upper face of the middle layer of the three-layer wiring board shown in FIG. 1.
Figure 4:
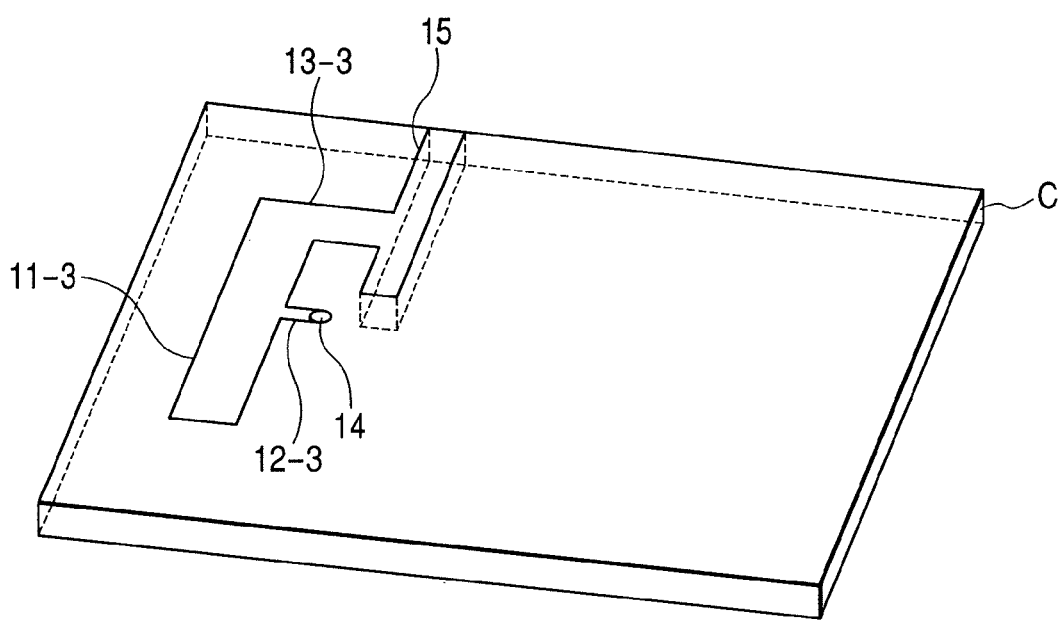
FIG. 4 is a perspective view showing an inverted-F antenna which is formed on the upper face of the lowermost layer of the three-layer wiring board shown in FIG. 1.
Figure 5:
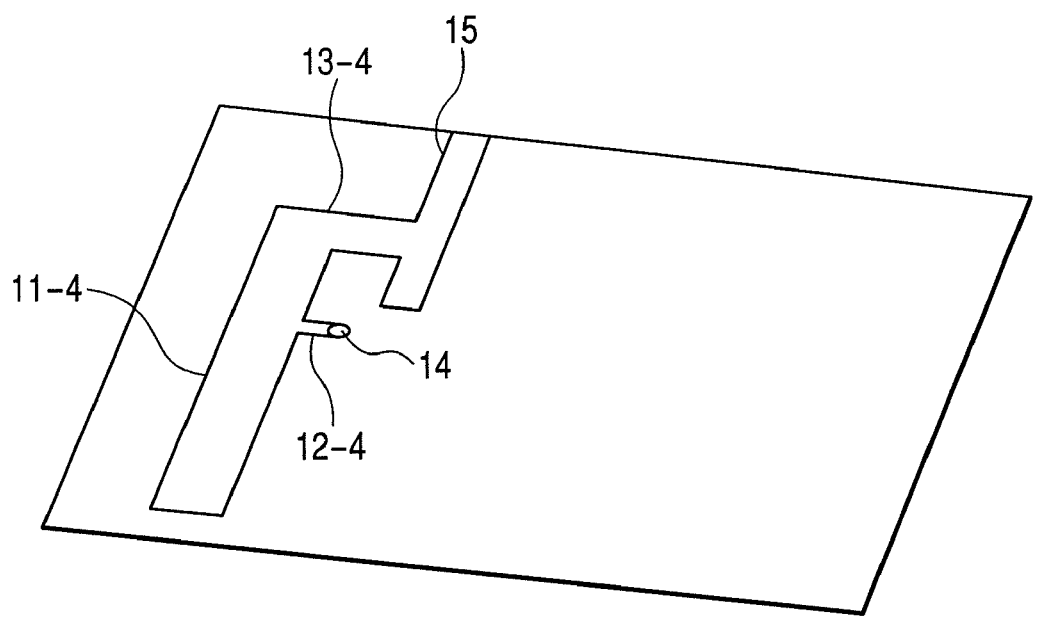
FIG. 5 is a perspective view showing an inverted-F antenna which is formed on the lower face of the lowermost layer of the three-layer wiring board shown in FIG. 1.

FIG. 1 is a perspective view of an antenna and a wiring board of a first embodiment of the invention. As an example, the case where the antenna 1 is incorporated in a three-layer wiring board will be described. However, the application of the invention is not restricted to the three-layer structure. The invention can be applied to a wiring board having a stacked structure of any number of layers. FIG. 2 is a perspective view showing an inverted-F antenna which is formed on the upper face of the uppermost layer of the three-layer wiring board shown in FIG. 1. FIG. 3 is a perspective view showing an inverted-F antenna which is formed on the upper face of the middle layer of the three-layer wiring board shown in FIG. 1. FIG. 4 is a perspective view showing an inverted-F antenna which is formed on the upper face of the lowermost layer of the three-layer wiring board shown in FIG. 1. FIG. 5 is a perspective view showing an inverted-F antenna which is formed on the lower face of the lowermost layer of the three-layer wiring board shown in FIG. 1. For the sake of convenience, hereinafter, the uppermost layer of the three-layer wiring board 2 is referred to as the A-layer, the middle layer as the B-layer, and the lowermost layer as the C-layer.

On the upper face of the A-layer which is the uppermost layer of the three-layer wiring board 2, a radiating element 11-1, a power supplying portion 12-1 which supplies an electric power to the radiating element 11-1, and a short-circuiting portion 13-1 which grounds the radiating element 11-1 are laid so as to form an inverted-F antenna. On the upper face of the B-layer which is the middle layer of the wiring board 2, a radiating element 11-2, a power supplying portion 12-2 which supplies an electric power to the radiating element 11-2, and a short-circuiting portion 13-2 which grounds the radiating element 11-2 are laid so as to form an inverted-F antenna. On the upper face of the C-layer which is the lowermost layer of the wiring board 2, a radiating element 11-3, a power supplying portion 12-3 which supplies an electric power to the radiating element 11-3, and a short-circuiting portion 13-3 whichgrounds the radiating element 11-3 are laid so as to form an inverted-F antenna. On the lower face of the C-layer of the wiring board 2, a radiating element 11-4, a power supplying portion 12-4 which supplies an electric power to the radiating element 11-4, and a short-circuiting portion 13-4 which grounds the radiating element 11-4 are laid so as to form an inverted-F antenna. Preferably, the formation of the inverted-F antenna in each of the A-, B-, and C-layers of the wiring board 2 is realized by, simultaneously with formation of a wiring pattern of each of the layers in a process of producing the wiring board, performing a patterning process using a conductive member for each layer.

A connecting portion 14 penetrates the A-, B-, and C-layers of the wiring board 2 to electrically connect the power supplying portions 12-1, 12-2, 12-3, and 12-4 with each other. For example, the connecting portion 14 is formed by using the through-hole technique. Alternatively, the connecting portion 14 may be realized in the form of connection due to a via. Alternatively, the connecting portion 14 may be realized by a conductive member having other configuration or shape. Preferably, electrical connections between an RF module and the power supplying portions 12-1, 12-2, 12-3, and 12-4 are realized by connecting the power supplying portion of a layer on which the RF module is mounted, to a power supply line to which the RF module is to be connected. In the illustrated example, it is assumed that the RF module (not shown) is mounted on the upper face of the A-layer of the wiring board 2. In this case, therefore, the power supplying portion 12-1 which is laid on the upper face of the A-layer of the wiring board 2 is connected to the RF module (not shown) via a power supply line 16. For example, the power supply line 16 is a microstrip line.

The short-circuiting portions 13-1, 13-2, 13-3, and 13-4 are connected to a ground line 15 in the A-, B-, and C-layers of the wiring board 2.

Figure 6:
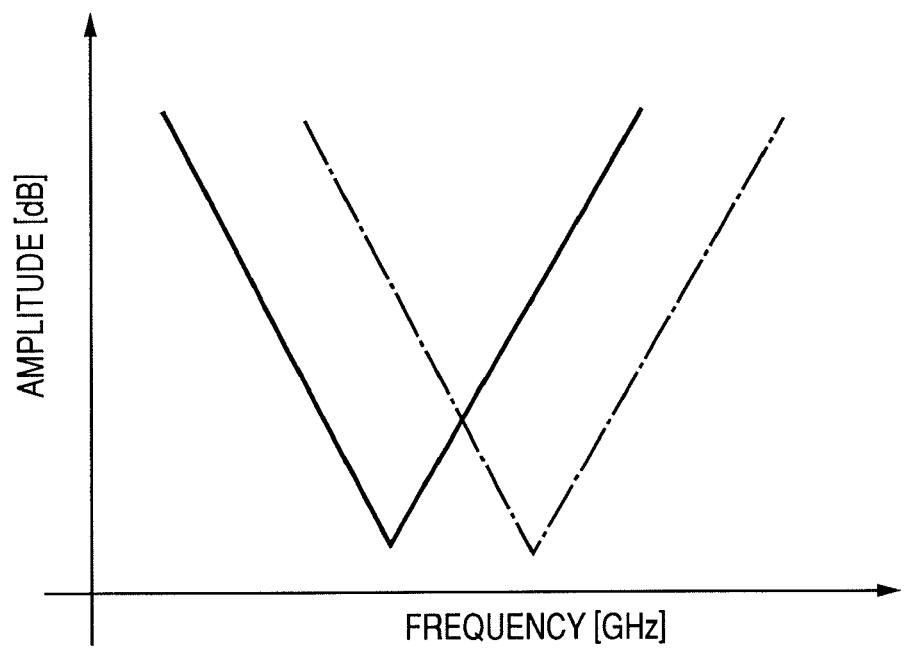
FIG. 6 is a view exemplarily showing relationships between the length of a radiating element of an antenna and the resonance frequency.

In the-embodiment, the lengths of the radiating elements 11-1, 11-2, 11-3, and 11-4 are different from each other. According to the configuration, it is possible to ensure a broad frequency band. FIG. 6 is a view exemplarily showing relationships between the length of a radiating element of an antenna and the resonance frequency. In the illustrated example, the case of two radiating elements is shown. When the lengths of the two radiating elements are set to be slightly different from each other, the frequency characteristics are slightly different from each other. When the lengths of the radiating elements are designed so that two resonances are generated at frequencies which are close to the electric power to be supplied to the antenna, therefore, the frequency band of the antenna can be widened. In order to improve the antenna characteristics, the radiating elements 11-1, 11-2, 11-3, and 11-4, the power supplying portions 12-1, 12-2, 12-3, and 12-4, and the short-circuiting portions 13-1, 13-2, 13-3, and 13-4 which are disposed on the layers of the wiring board 2 are formed at positions where they overlap with each other when the wiring board 2 is planarly viewed from the upper face side (or the lower face side). In this case, since the radiating elements 11-1, 11-2, 11-3, and 11-4 have different lengths for the purpose of improving the frequency band, portions which, as planarly viewed, are not overlapping with each other by the degree corresponding to the length differences of the radiating elements are formed in the layers.

When the radiating elements are formed so as to have the same length, the gain to be obtained is increased. When sets of radiating elements having the same length are adequately combined, therefore, the gain can be adjusted in addition the frequency band.

As the wiring board 2 incorporating the antenna of the invention, for example, a wiring board in which glass epoxy boards are stacked, or a wiring board configured by a build-up board can be used.

In the case of a wiring board using glass epoxy boards, for example, the wiring board 2 incorporating the antenna is formed by forming patterns such as the antenna by the subtractive method, forming a penetration hole in the glass epoxy boards by a drilling process, and forming a through hole (connecting portion 14) by a plated layer which is disposed on the inner wall of the penetration hole.

In the case of a wiring board using a build-up board, wiring layers each having an insulating layer, an antenna, and the like are stacked by the build-up method, and the wiring layers are connected to each other through vias formed in the insulating layers.

The patterns of the wiring layers and the vias are formed by, for example, the semi-additive method. The vias are formed by, when the semi-additive method is applied, forming an opening through which a wiring layer of a lower wiring layer is exposed, by a laser process, and disposing a plated layer on the inner wall of the opening.

Figure 7:
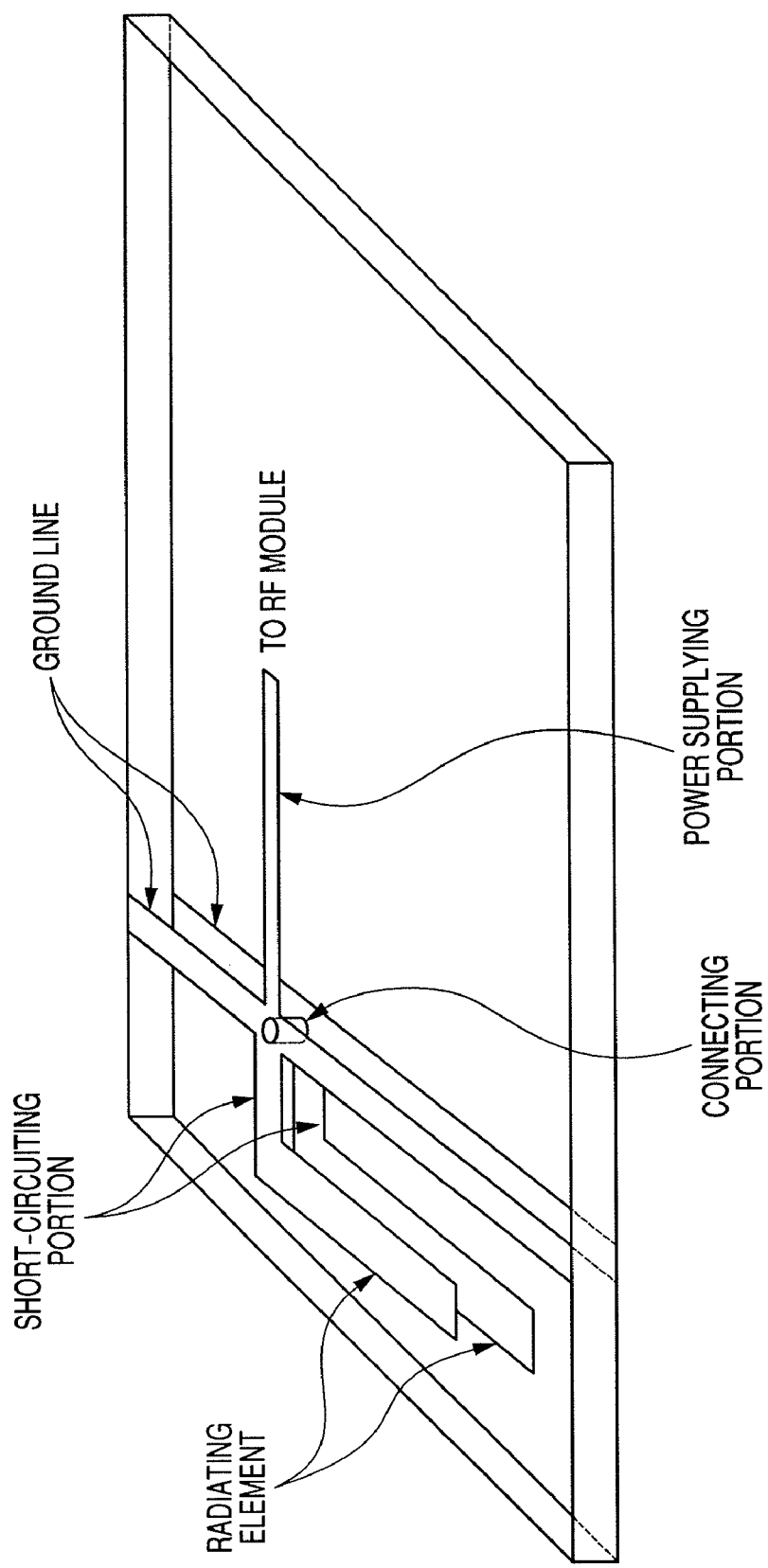
FIG. 7 is a perspective view showing an inverted-L antenna which is formed in one layer of the multilayered wiring board of a modified example of the first embodiment of the invention.

As described above, according to the first embodiment of the invention, in a multilayer wiring board, inverted-F antennas each of which is configured by a radiating element, a power supplying portion that supplies an electric power to the radiating element, and a short-circuiting portion that grounds the radiating element are laid on faces of layers of the wiring board, respectively, and the power supplying portions positioned in the respective layers are connected to each other by the connecting portion which penetrates the layers of the wiring board. In the wiring board of the first embodiment shown in FIGS. 1 to 5, an inverted-F antenna is formed on each of all the layers of the wiring board. In a modification, an inverted-F antenna may be formed on each of restricted ones of the layers. Alternatively, the radiating elements, the power supplying portions, and the short-circuiting portions may not formed as inverted-F antennas, but, in several ones of the layers or in all the layers, formed as inverted-L antennas. In the inverted-L antenna, the short-circuiting portion serves as the power supplying portion. For example, FIG. 7 shows the structure of the inverted-L antenna formed in one layer of the multilayered wiring board.

Figure 8:
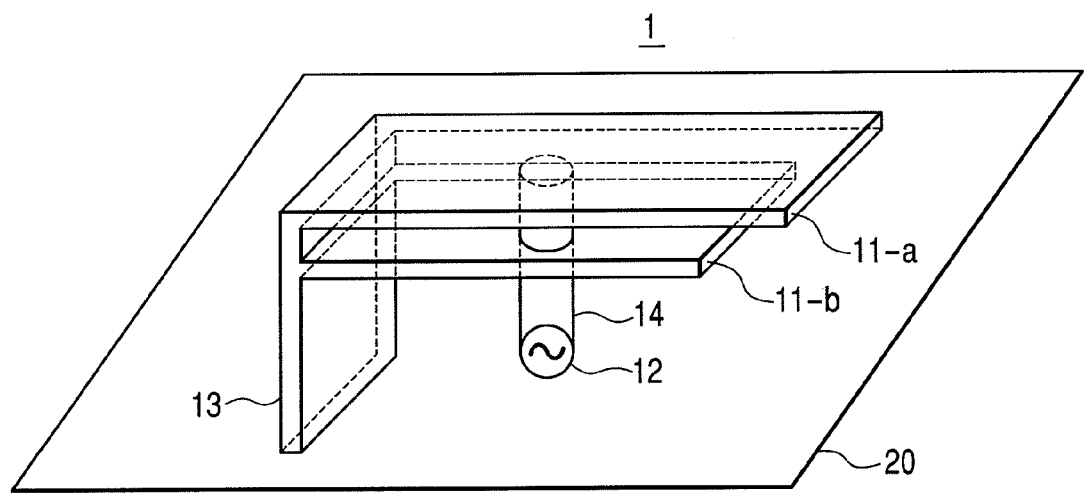
FIG. 8 is a perspective view of an antenna and a wiring board of a second embodiment of the invention.
Figure 9:
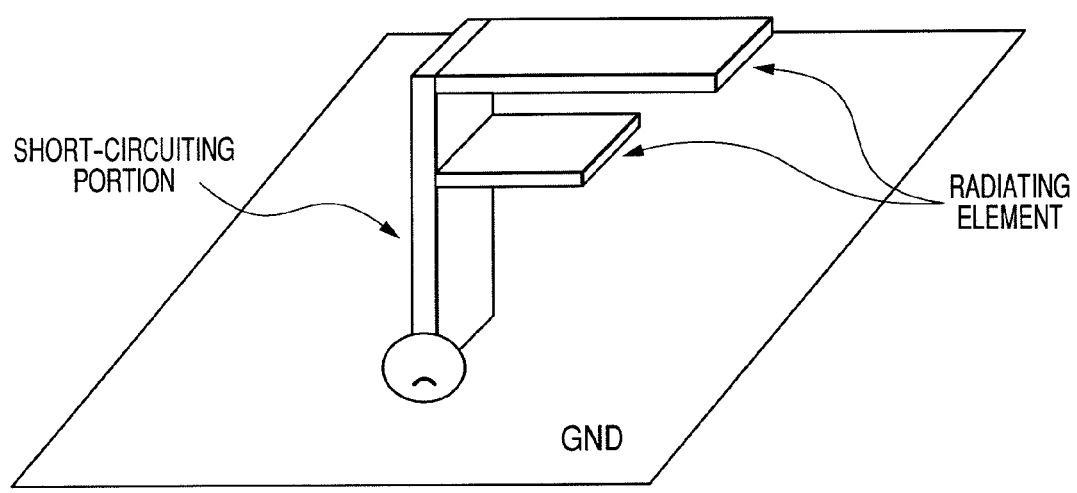
FIG. 9 is a perspective view of an inverted-L antennas of a modified example of the second embodiment of the invention.
Figure 10A:
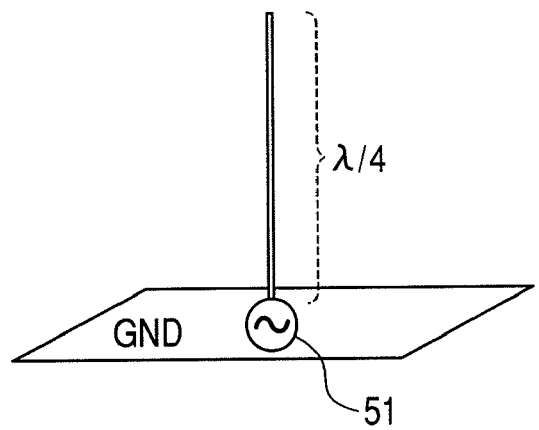
FIG. 10A shows a monopole antenna which is one of usual quarter-wave antennas.
Figure 10B:
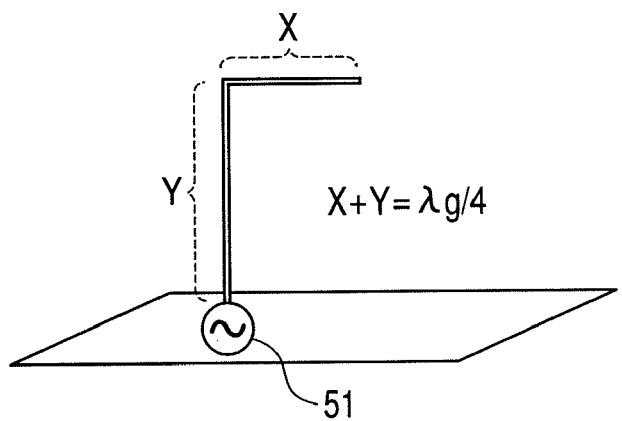
FIG. 10B shows an inverted-L antenna which is one of usual quarter-wave antennas.
Figure 10C:
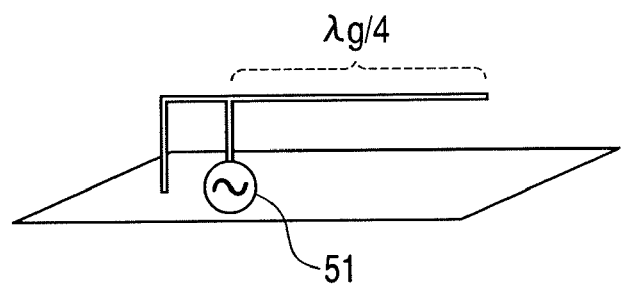
FIG. 10C shows an inverted-F antenna which is one of usual quarter-wave antennas.
Figure 11:
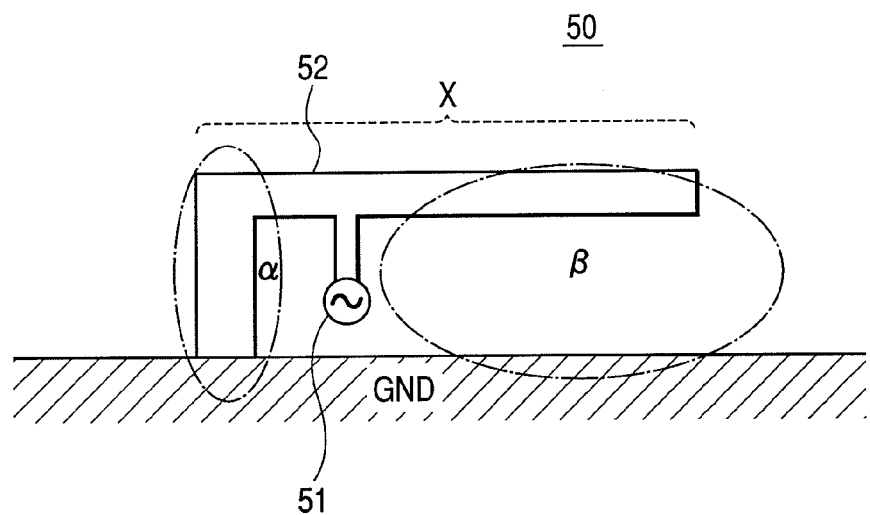
FIG. 11 is a diagram showing the basic principle of a usual inverted-F antenna.
Figure 12:
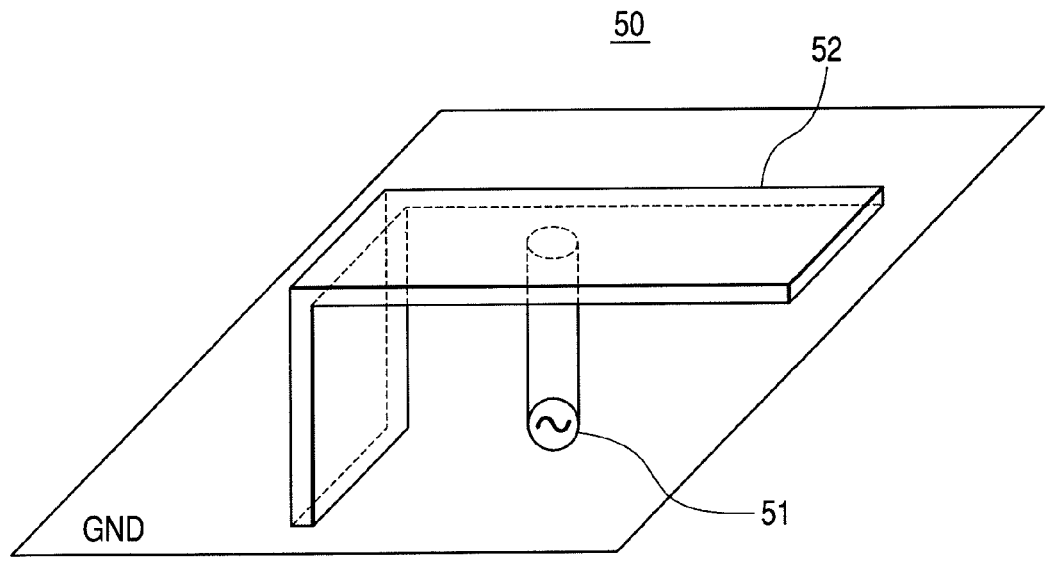
FIG. 12 is a perspective view exemplarily showing a usual three-dimensional inverted-F antenna.

FIG. 8 is a perspective view of an antenna and a wiring board of a second embodiment of the invention. The antenna 1 of the embodiment comprises two radiating elements 11-a and 11-b, a power supplying portion 12 which supplies an electric power to the radiating elements 11-a and 11-b, and a short-circuiting portion 13 which connects the radiating elements 11-a and 11-b to a grounding plate (GND) 20. As illustrated, an inverted-F antenna configured by the two radiating elements 11-a and 11-b, the power supplying portion 12, and the short-circuiting portion 13 is three-dimensionally formed. The radiating elements 11-a and 11-b have different lengths. According to the configuration, it is possible to ensure a broad frequency band. When the radiating elements are formed so as to have the same length in the same manner as the first embodiment, the gain is improved. In the embodiment, the number of the radiating elements is two. The invention is not restricted to this. Alternatively, the radiating elements may be plural. Further, the radiating elements, the power supplying portion, and the short-circuiting portion are formed as inverted-L antennas as shown in FIG. 9.

The invention can be applied to an antenna which is included in a small radio apparatus. Examples of the small radio apparatus to which the invention can be applied are a portable telephone, a PDA, an IC card reader/writer, an audio apparatus, a video apparatus, a game machine, a bar code reader, and a clock.

According to the invention, an antenna which is small in size, which has high performance, and which can be easily produced, and also a multilayer wiring board which incorporates the antenna are realized. Therefore, the invention contributes also to further miniaturizing and sophisticating a small radio apparatus.

According to the invention, in a production process, also a step of incorporating the antenna into a small radio apparatus is facilitated. In formation of a wiring pattern of each of the layers of the wiring board, the radiating element, the power supplying portion, and the short-circuiting portion which constitute an inverted-F antenna are formed at the same time, whereby, in production of an inverted-F antenna and a small radio apparatus including an inverted-F antenna, shortening of the production time, and reduction of the production cost can be realized.

Since the radiating elements have different lengths, it is possible to ensure a broad frequency band. The antenna of the invention has a structure which is a sort of a stack of plural inverted-F antennas. Unlike a related-art single inverted-F antenna, therefore, antenna characteristics can be improved without changing the area occupied by the antenna.

What is claimed is:

1. An antenna which is incorporated in a multilayer wiring board, wherein said antenna comprises:

a plurality of radiating elements, each radiating element being laid on a face of a respective layer of said wiring board;

a plurality of power supplying portions, each power supplying portion corresponding to one of the plurality of radiating elements, and each power supplying portion being laid on the face of the layer having the corresponding radiating element to directly supply electric power to the corresponding radiating element;

a plurality of short-circuiting portions, each short-circuiting portion corresponding to one of the plurality of radiating elements, and each short-circuiting portion being laid on the face of the layer having the corresponding radiating element to ground the corresponding radiating element; and a connecting portion which penetrates said layers of said wiring board, and through which said power supplying portions are electrically connected to each other, the connecting portion being spaced from the short-circuiting portions.

2. An antenna according to claim 1, wherein inverted-F antennas are formed for said layers, respectively, said inverted-F antennas being configured by said radiating elements, said power supplying portions, and said short-circuiting portions.

3. An antenna according to claim 1, wherein said radiating elements have different lengths.

4. An antenna according to claim 1, wherein said radiating elements, said power supplying portions, and said short-circuiting portions are patterned for each of said layers.

5. An antenna according to claim 1, wherein said connecting portion is configured by a through hole.

\* \* \* \* \*